United States Patent
Begue et al.

(10) Patent No.: US 10,886,472 B2
(45) Date of Patent: Jan. 5, 2021

(54) ALTERNATIVE ACCEPTOR MATERIALS BASED ON HEXABENZOCORONENE

(71) Applicants: Centre national de la recherche scientifique, Paris (FR); Université de Pau et des Pays de l'Adour, Pau (FR)

(72) Inventors: Didier Begue, Serres Morlaas (FR); Roger Clive Hiorns, Arudy (FR); Hugo Santos-Silva, Pau (FR)

(73) Assignees: CENTRE NATIONAL DE LA RECHERCHE SCIENTIFIQUE, Paris (FR); UNIVERSITÉ DE PAU ET DES PAYS DE L'ADOUR, Pau (FR)

( * ) Notice: Subject to any disclaimer, the term of this patent is extended or adjusted under 35 U.S.C. 154(b) by 0 days.

(21) Appl. No.: 16/332,718

(22) PCT Filed: Sep. 11, 2017

(86) PCT No.: PCT/FR2017/052398
§ 371 (c)(1),
(2) Date: Mar. 12, 2019

(87) PCT Pub. No.: WO2018/046872
PCT Pub. Date: Mar. 15, 2018

(65) Prior Publication Data
US 2019/0221743 A1   Jul. 18, 2019

(30) Foreign Application Priority Data
Sep. 12, 2016   (FR) ...................................... 16 58459

(51) Int. Cl.
*C08G 61/12* (2006.01)
*H01L 51/00* (2006.01)
*H01L 51/42* (2006.01)

(52) U.S. Cl.
CPC ........ *H01L 51/0036* (2013.01); *C08G 61/126* (2013.01); *H01L 51/0043* (2013.01);
(Continued)

(58) Field of Classification Search
CPC ............................... B82B 1/00; C07C 319/20
(Continued)

(56) References Cited

U.S. PATENT DOCUMENTS

2012/0024382 A1  2/2012 Holmes et al.
2016/0204348 A1  7/2016 Yu et al.

FOREIGN PATENT DOCUMENTS

| CN | 104961665 A | * 10/2015 | ........... C07C 319/20 |
| JP | 2009-209067 A | * 9/2009 | ............... B82B 1/00 |
| JP | 2011-102271 A | * 5/2011 | ............... B82B 1/00 |

OTHER PUBLICATIONS

Wu et al., "Graphenes as Potential Material for Electronics", Chem., Rev., 2007, 107, pp. 718-747.*
(Continued)

*Primary Examiner* — Khanh T Nguyen
(74) *Attorney, Agent, or Firm* — B. Aaron Schulman, Esq.; Stites & Harbison, PLLC

(57) ABSTRACT

The invention relates to a compound comprising a hexabenzocoronene core to which are bonded, in position 2 and 5, a polymer ZP46, optionally via a spacer, and to which are bonded substituents selected from a group —COOH, —C≡N, —N+≡C, —O—C≡N or CF₃, at position 1, 3, 4, and 6; a donor:acceptor layer comprising it, and a device comprising such a compound and such a layer and its use in the field of organic photovoltaic cells.

9 Claims, 10 Drawing Sheets

Figures 1, 2:
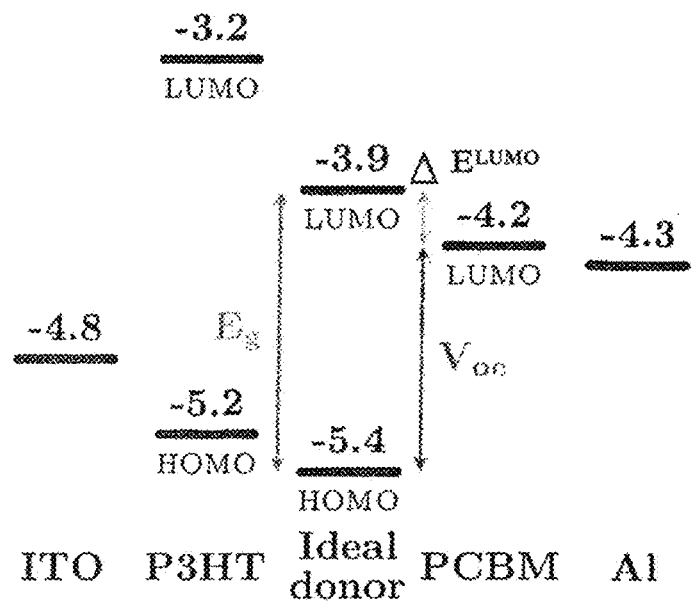

(52) U.S. Cl.
CPC .... *H01L 51/0056* (2013.01); *C08G 2261/124* (2013.01); *C08G 2261/1424* (2013.01); *C08G 2261/18* (2013.01); *C08G 2261/314* (2013.01); *C08G 2261/3243* (2013.01); *C08G 2261/344* (2013.01); *C08G 2261/77* (2013.01); *C08G 2261/91* (2013.01); *H01L 51/4253* (2013.01); *Y02E 10/549* (2013.01)

(58) Field of Classification Search
USPC .......................................................... 136/263
See application file for complete search history.

(56) References Cited

OTHER PUBLICATIONS

Zhang et al., "Efficient Polymer Solar Cells Based on the Copolymers of Benzodithiophene and Thienopyrroledione", Chem. Mater., 2010, 22, pp. 2696-2698.*
Piliego et al., "Synthetic Control of Structural Order in N-Alkylthieno[3,4-c]pyrrole-4,6-dione-Based Polymers for Efficient Solar Cells", J. Am. CHem. Soc., 2010, 132, pp. 7595-7597.*
D. Begue et al: "Graphene-based acceptor molecules for organic photovoltaic cells: a predictive study identifying high modularity and morphological stability", RSC Advances: An International Journal to Further the Chemical Sciences, vol. 6, No. 17, Jan. 25, 2016 (Jan. 25, 2016), pp. 13653-13656, XP055271725, GB ISSN: 2046-2069, DOI: 10.1039/C5RA25531G abstract figures 1,2.
David J. Jones et al: "Synthesis of electron-poor hexa-peri-hexabenzocoronenes", Chemical Communications, vol. 48, No. 65, Jul. 6, 2012 (Jul. 6, 2012), p. 8066, XP055205321, ISSN: 1359-7345, DOI: 10.1039/c2cc33892k schema 1; figure 1.
Chen Gao et al: 11 Incorporation of Hexaperi-hexabenzocoronene (HBC) into Carbazole-Benzo-2,1,3-thiadiazole Copolymers to Improve Hole Mobility and Photovoltaic Performance, Chemistry—An Asian Journal, vol . 11, No. 5, Jan. 28, 2016 (Jan. 28, 2016), pp. 766-774, XP055371659, DE ISSN: 1861-4728, DOI: 10.1002/asia.201501271 abstract; figures 1,2.
Christina M. Thompson et al: "Substituent Effects on the Gas Sorption and Selectivity Properties of Hexaphenylbenzene and Hexabenzocoronene Based Porous Polymers", Macromolecules, vol. 47, No. 24, Dec. 23, 2014 (Dec. 23, 2014), pp. 8645-8652, XP055271594, us ISSN: 0024-9297, DOI: 10.1021/ma501663j abstract schema 1.
International Search Report for PCT/FR2017/052398, dated Nov. 16, 2017.
Written Opinion of the International Search Authority for PCT/FR2017/052398, dated Nov. 16, 2017.
Preliminary Search Report for FR 1658459, dated May 17, 2017.

* cited by examiner

Without spacer

CN
HOMO

LUMO

Without spacer
$CF_3$
HOMO

LUMO

Without spacer
F
HOMO

LUMO

Without spacer
NH$_2$
HOMO

LUMO

Without Spacer
NO₂
HOMO

LUMO

-CONH- Spacer
CF₃
HOMO

LUMO

-CONH- Spacer
CN
HOMO

LUMO

-CONH- Spacer
COOH
HOMO

LUMO

Figure 10

-CONH- Spacer
F
HOMO

LUMO

Figure 11

-CONH- Spacer
NH$_2$
HOMO

LUMO

Figure 12

-CONH- Spacer
NO₂
HOMO

LUMO

-COO- Spacer
CF₃
HOMO

LUMO

-COO- Spacer
CN
HOMO

LUMO

-COO- Spacer  
COOH  
HOMO

LUMO

-COO- Spacer  
F  
HOMO

LUMO

-COO- Spacer  
$NH_2$  
HOMO

LUMO

-COO- Spacer
NO$_2$
HOMO

LUMO

-CC- Spacer
CF$_3$
HOMO

LUMO

-CC- Spacer
CN
HOMO

LUMO

-CC- Spacer
COOH
HOMO

LUMO

-CC- Spacer
F
HOMO

LUMO

-CC- Spacer
NH₂
HOMO

LUMO

-CC- Spacer
NO₂
HOMO

LUMO

ALTERNATIVE ACCEPTOR MATERIALS BASED ON HEXABENZOCORONENE

FIELD OF THE INVENTION

The invention relates to a compound based on hexabenzocoronene, a donor:acceptor layer comprising it, and a device comprising such a compound or such a layer.

BACKGROUND OF THE INVENTION

The demand for organic photovoltaic cells that are efficient in terms of performance and service life is becoming increasingly important. This performance depends on the characteristics of the constituent materials. These materials must make it possible: to maximize the absorbed solar energy, to generate electric charge carriers (electrons and holes) from the solar energy, to extract these electrons and these holes efficiently, while limiting the resistive losses, recombinations and short circuits.

However, some of these properties are largely related to the nature of the active layer of these devices which consists of donor:acceptor pairs.

From the point of view of performance and stability, the composite couple poly(3-hexylthiophène):[6]-phényl-$C_{61}$-méthylbutyrate (P3HT:PCBM) has long been a standard.

However, the weak electronic correlation between the donor (P3HT) and the acceptor (PCBM), combined with many morphological instabilities at the heterojunction core are two of the major problems of this donor:acceptor pair. The search for a better correlation between the electronic properties ranges from minor modifications of the chemical structure of one of the components of the pair to complete replacement of the donor molecule or the acceptor molecule. In this context, graphene-based materials have quickly emerged as good acceptor candidates, mainly because of their outstanding semiconducting properties.

In particular, Johns et al., In Synthesis of electron-for-hexa-peri-hexabenzocoronene, "Chem Commun, 2012, 48, 8066-8068, describe a series of hexabenzocoronene (HBC) derivatives containing Br, F, $CF_3$ and aryl substituents that are said to be suitable acceptors as a substitute for PCBM in the composite couple P3HT:PCBM.

However, the short circuit current $J_{sc}$ of this composite couple is almost zero, so the efficiency of organic photovoltaic (OPV) devices using this composite couple is also virtually zero. The efficiency depends on the product (Voc× $J_{sc}$×FF) divided by the incoming power, where FF is the fill factor and Voc is the open circuit voltage. In addition, the donor and the acceptor are in a mixture and are not covalently connected, and therefore the transfer charge is hampered by the disorganization at the nanometer level.

Likewise, L. Schmidt et al., in "Sciences", 111, 193, 2001 describe columnar systems in which the HBC donor and the perylene acceptor are both modified by the grafting of alkyl chains to replace some of the hydrogen atoms initially present. However, the electronic levels of the HBC entities are not modified by the grafting of the alkyl chains (no modification of the electronic efficiency is therefore observed), while the donor and the acceptor have not been linked covalently to provide structural stability and self-organization in order to optimize charge collection and transfer to the electrodes.

However, the materials of the organic photovoltaic cells should ideally be adapted and organized for maximum efficiency at each stage of the process of converting solar energy into electricity.

Recently, the inventors have published modeling work on novel donor:acceptor materials (Bégué et al., RSC Advances, 2006, 13653) in which they describe hexabenzocoronenes functionalized by four carboxylic groups, and to which a conjugated polymer has been directly attached. The conjugated polymer is either P3HT or poly(oxypentyl-thiophene) (P3OPT). According to the modeling carried out, this arrangement would induce a columnar supramolecular arrangement according to a discotic liquid crystal characteristic favoring the dissociation of the charges and their transfer in the direction of the rr stack.

Furthermore, current devices offer high stabilities (more than 15 years), but require a very expensive encapsulation step because of their sensitivity to oxygen, problems of water infiltration, and possible thermal damage. This is because current materials are all too unstable due to their chemical sensitivity and irreversible structural changes observed across the active layer.

In addition, all the existing organic photovoltaic cells that have been described have a problem of stability in the face of the auto-oxidation phenomenon. In this context, very recently, the formation of a polymer, called ZP46, obtained from the monomers benzo[1,2-b;3,4-b] dithiophene and thieno[3,4-c]pyrol-4,6-dione has led to photochemically stable systems thanks in particular to a compact spatial arrangement that creates a shielding effect that is very resistant to oxygen attacks.

SUMMARY OF THE INVENTION

Therefore, a first object of the invention is a compound based on hexabenzocoronene of the following formula I:

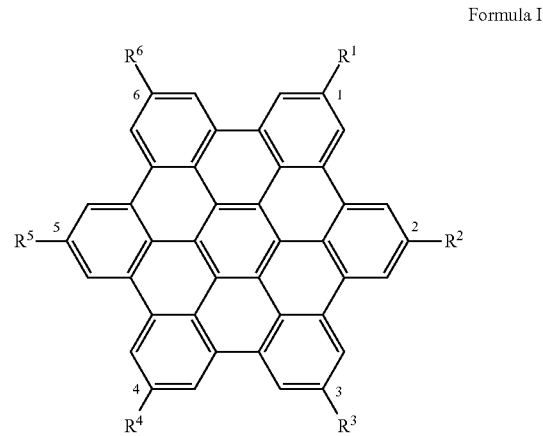

Formula I in which:

$R^1$, $R^3$, $R^4$ and $R^6$ are chosen independently of one another, from a carboxylic group (—COOH), a cyano group (—C≡N), an isocyanate group (~N+≡C), a cyanate group (—O—C≡N) and a $CF_3$ group, and $R^2$ and $R^5$ have the following formula (1):

$X_{(n1)}$—ZP46    Formula (1)

in which:

X is a spacer group selected from a group —COO— and a group —CONH—, $n_1$=0 or 1, and ZP46 has the following formula (2):

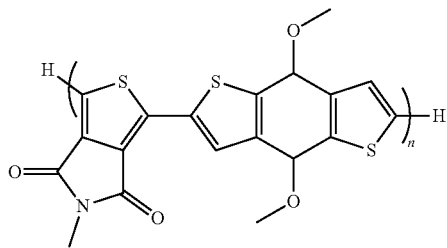

Formula (2)

In formula 2, as will be apparent to those skilled in the art, n denotes the number of repeating units of the polymer of formula (2).

This compound has proved particularly suitable for forming the active (donor:acceptor) layer of an organic photovoltaic cell.

In fact, the inclusion of this compound which combines a hexabenzocoronene substituted at the 1, 3, 4 and 6 positions by a carboxylic or cyano or isocyanate or cyanate group or a fluorine atom and the ZP46 polymer, makes it possible to increase the properties of resistance to the photo-oxidation of the active layer of an OPV, for example.

In the compound of the invention, preferably, the substituents at $R^1$, $R^3$, $R^4$ and $R^6$ (the substituents at the 1, 3, 4 and 6 positions) are carboxylic groups.

However, in a particularly preferred embodiment, the hexabenzocoronene compound of the invention is the compound of Formula I wherein $n_1=1$.

In fact, when $n_1=0$, it has been found that, although the resistance to photooxidation of the active layer is increased, the combination of the two materials (hexabenzocoronene compound functionalized with carboxylic, cyano, isocyano, cyanate or $CF_3$ and polymer ZP46 groups) is not optimal from the point of view of the electronic properties, and that this defect may be corrected by the inclusion of a chemical function —COO— or —CONH— which acts as a spacer between the donor and acceptor without denaturation of the structural properties or photoresist properties of the HBC compound.

Thus, a very particularly preferred compound of the invention is the compound of formula I-1 below:

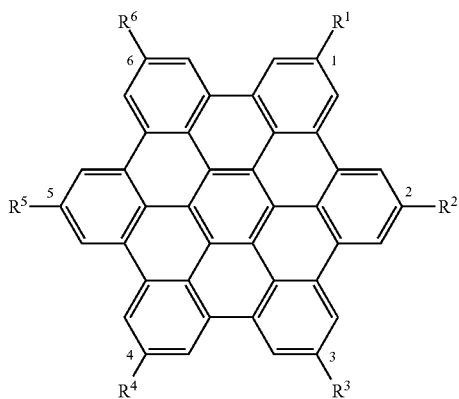

Formula I-1 in which $R^1$, $R^3$, $R^4$ and $R^6$ are carboxylic groups, and $R^2$ and $R^5$ have the formula —COO—ZP46.

The invention also provides an active layer comprising a hexabenzocoronene compound of the invention. It also proposes a device comprising such a compound or such a layer. More particularly, such a device is a photovoltaic cell.

BRIEF DESCRIPTION OF THE DRAWING FIGURES

Figure 3:
Figure 3:
Figure 4:
Figure 4:
Figure 5:
Figure 5:
Figure 6:
Figure 6:
Figure 7:
Figure 7:
Figure 8:
Figure 8:
Figure 9:
Figure 9:
Figure 13:
Figure 13:
Figure 14:
Figure 14:
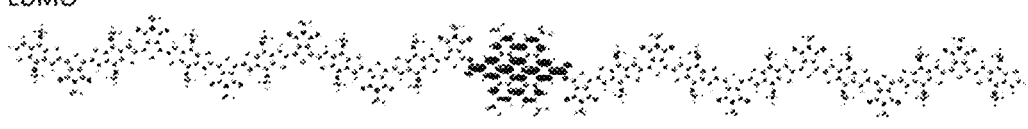
Figure 15:
Figure 15:
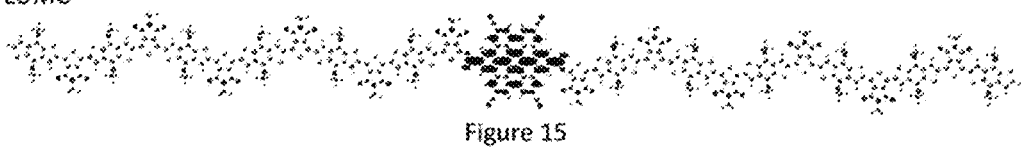
Figure 16:
Figure 16:
Figure 17:
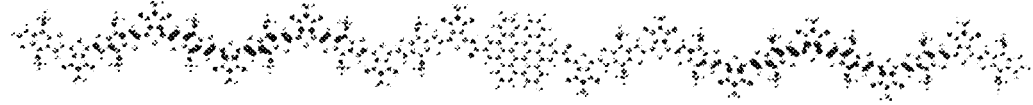
Figure 17:
Figure 18:
Figure 18:
Figure 19:
Figure 19:
Figure 20:
Figure 20:
Figure 21:
Figure 21:
Figure 22:
Figure 22:
Figure 23:
Figure 23:
Figure 24:
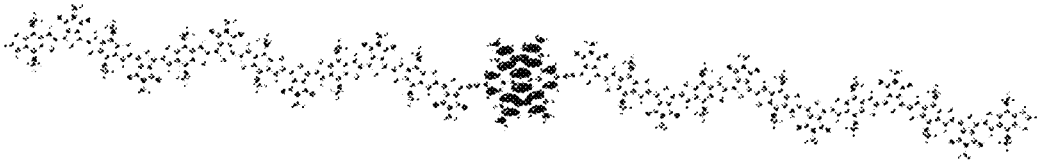
Figure 24:
Figure 25:
Figure 25:
Figure 26:
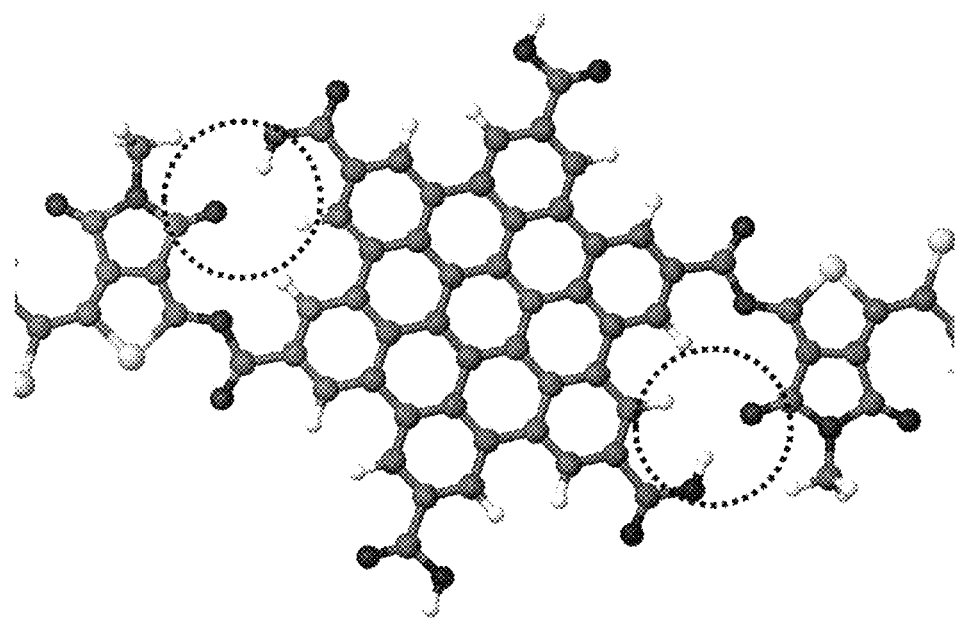

The invention will be better understood and other features and advantages thereof will appear more clearly upon reading the following description which is made with reference to the figures, wherein:

FIG. 1 shows the band structure of the donor:acceptor couple P3HT:PCBM compared to that of an ideal donor:acceptor couple, FIG. 2 shows the localization of the HOMO and LUMO molecular orbitals of the compound according to the invention of Example 1, FIG. 3 shows the localization of the HOMO and LUMO molecular orbitals of the compound of the invention of Example 2, FIG. 4 shows the localization of the HOMO and LUMO molecular orbitals of the compound according to the invention of Example 3, FIG. 5 shows the localization of the HOMO and LUMO molecular orbitals of the compound not forming part of the invention, of Comparative Example 1, FIG. 6 shows the localization of the HOMO and LUMO molecular orbitals of the compound, not forming part of the invention, of Comparative Example 2, FIG. 7 shows the localization of the HOMO and LUMO molecular orbitals of the compound, not forming part of the invention, of Comparative Example 3, FIG. 8 shows the localization of the HOMO and LUMO molecular orbitals of the compound according to the invention of Example 4, FIG. 9 shows the localization of the HOMO and LUMO molecular orbitals of the compound according to the invention of Example 5, FIG. 10 shows the localization of the HOMO and LUMO molecular orbitals of the compound according to the invention of Example 6, FIG. 11 shows the localization of the HOMO and LUMO molecular orbitals of the compound, not forming part of the invention, of Comparative Example 4, FIG. 12 shows the localization of the HOMO and LUMO molecular orbitals of the compound, not forming part of the invention, of Comparative Example 5, FIG. 13 shows the localization of the HOMO and LUMO molecular orbitals of the compound, not forming part of the invention, of Comparative Example 6, FIG. 14 shows the localization of the HOMO and LUMO molecular orbitals of the compound according to the invention of Example 7, FIG. 15 shows the localization of the HOMO and LUMO molecular orbitals of the compound according to the invention of Example 8, FIG. 16 shows the localization of the HOMO and LUMO molecular orbitals of the compound according to the invention of Example 9, FIG. 17 shows the localization of the HOMO and LUMO molecular orbitals of the compound, not forming part of the invention, of Comparative Example 7, FIG. 18 shows the localization of the HOMO and LUMO molecular orbitals of the compound, not forming part of the invention, of Comparative Example 8, FIG. 19 shows the localization of the HOMO and LUMO molecular orbitals of the compound, not forming part of the invention, of Comparative Example 9, FIG. 20 shows the localization of the HOMO and LUMO molecular orbitals of the compound, not forming part of the invention, of Comparative Example 10, FIG. 21 shows the localization of the HOMO and LUMO molecular orbitals of the compound, not forming part of the invention, of Comparative Example 11, FIG. 22 shows the localization of the HOMO and LUMO molecular orbitals of the compound, not forming part of the invention, of Comparative Example 12, FIG. 23 shows the localization of the HOMO and LUMO molecular orbitals of the compound, not forming part of the invention, of Comparative Example 13, FIG. 24 shows the localization of the HOMO and LUMO molecular orbitals of the compound, not forming part of the invention, of Comparative Example 13, FIG. 25 shows the localization of the HOMO and LUMO molecular orbitals of the compound, not forming part of the invention, of Comparative Example 14, and FIG. 26 shows a schematic representation of the molecule according to the invention of Example 9.

DETAILED DESCRIPTION OF THE INVENTION

On the basis of the comparison between the HOMO-LUMO energy gap of the P3HT:PCBM couple and that of a ideal donor:acceptor couple, schematically represented in FIG. 1, the key optimization parameters to obtain a suitable and optimized material for maximum efficiency of an organic photovoltaic cell at each stage of the process of converting solar energy into electricity, are briefly summarized as being:

(i) the difference in energy between the LUMO of the donor and the LUMO of the acceptor ($\Delta E^{LUMO}$), which must be of the order of 0.3 eV to ensure ideal efficiency during exciton transfer. This value is sufficient to cause ultra fast electron transfer from the donor to the acceptor and can not be reduced due to the possibility of reverse charge transfer, (ii) the band gap ($E_g$) of the donor molecule which must be close to 1.5 eV. For P3HT, this value is about 1.9 eV and therefore too high, thus limiting the absorption of light in the infrared range by the polymer, (iii) the open circuit voltage Voc must be adjusted: if it is too high, a large amount of energy is lost. If it is too low, the resulting OPV will operate at a low voltage that is not needed, making the conversion of potential energy inefficient, and (iv) this ideal donor:acceptor couple must resist, in particular, the photo-oxidation.

The inventors have now discovered novel graphene-based materials, more specifically compounds based on hexabenzocoronenes, which fulfill all of these parameters that govern the efficiency of the organic photovoltaic device from the points of view of both electronic stability and resistance to oxidation.

More specifically, the compounds of the invention are compounds having the following Formula I:

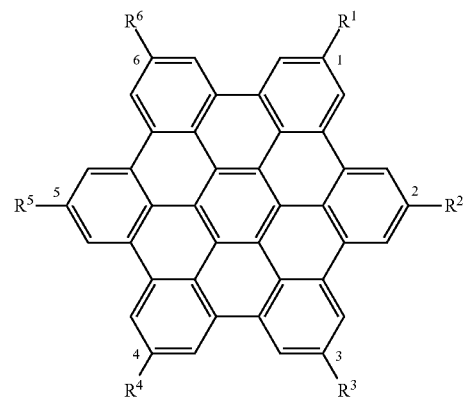

Formula I in which:
$R^1$, $R^3$, $R^4$ and $R^6$ are chosen independently of one another, from a carboxylic group (—COOH), a cyano group (—C≡N), an isocyanate group (~N$^+$≡C—), a cyanate group (—O—C≡N), and a $CF_3$ group, and
$R^2$ and $R^5$ have the following formula (1):

$$X_{(n1)}\text{—ZP46} \qquad \text{Formula (1)}$$

in which:
X is a spacer group selected from a group —COO— and a group —CONH—,
$n_1=0$ or 1, and
ZP46 has the following formula (2):

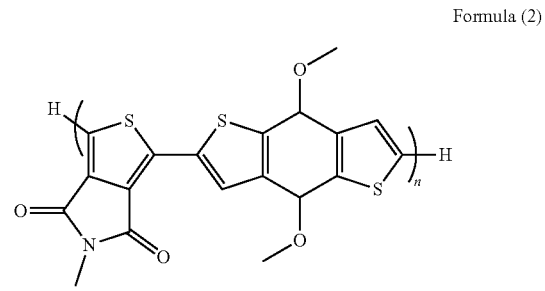

Formula (2)

These compounds are superior to the PCBM and because of their bi-dimensionality, they avoid the micro-aggregations of the PCBM resulting in a rupture of the morphology and a rupture of the active layer and the device.

They increase the lengths of the exciton paths and facilitate the transport of charges.

This is due to the columnar structure of these compounds which provides a channel for the electronic flux, and thus allows the charges to diffuse without loss of charge to the electrode by a favorable graphene/electrode interaction.

The columnar structure is obtained by the choice of the position and the nature of the substituents $R^1$, $R^3$, $R^4$ and $R^6$ in Formula I. Such a choice makes it possible to obtain a stack that is close to the optimum of the various layers of the HBC of the 'invention.

This columnar structure is very stable because of the choice of the substituents $R^1$, $R^3$, $R^4$ and $R^6$.

In addition, all these substituents $R^1$, $R^3$, $R^4$ and $R^6$ make it possible to adjust the electronic levels of the graphene of the HBC core, so that these levels are in the optimum phase for the electronic transfer of the donor system to the acceptor system.

Among the substituents, which are selected from a carboxyl group, a cyano group, an isocyanate group, a cyanate group and a —CF$_3$ group, for R$^1$, R$^3$, R$^4$ and R$^6$, a carboxylic group is particularly preferred because it is easier to graft on the HBC core.

In the compound of the invention, positions 2 and 5 are occupied by a conductive polymer ZP46, preferably via a spacer.

The ZP46 polymer has the following formula (2):

Formula (2)

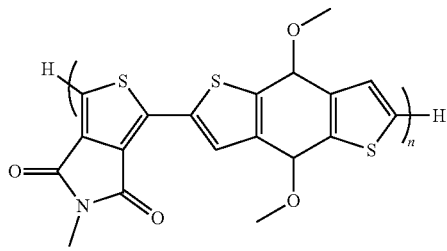

This polymer makes it possible to confer on the compounds of the invention, a stability that is both morphological and photochemical.

The supramolecular structure of the polymer ZP46 is determined by the non-binding interactions O . . . H and O . . . S in the two comonomers of which it is composed, i.e. the benzo(1,2-b;3,4-b) thiophene and thieno[3,4-c]pyrol-4,6-dione.

This supramolecular structure can block the chains in a planar configuration[1] that can induce a mimetic discotic liquid crystal feature with adjacent chains based on the same interactions.

[1] Nicolas E. Jackson et al. «Controlling conformation of conjugated polymers and molecules, the wall of non-binding interaction», *Journal of the American Chemical Society*, 135, 28:10475-10483, 2013

For a donor:acceptor couple to have an efficiency for application in a photovoltaic cell, it is first necessary that this donor:acceptor couple makes it possible to obtain good localization of the electrons in the basic state (HOMO molecular orbital) in the donor part (in the compounds of Formula II in the ZP46 polymers), and to transfer these electrons in a localized manner in the acceptor part during a light emission (LUMO molecular orbital) of the compounds of the invention, i.e. in the hexabenzocoronene part (in the compound of Formula I).

It is then necessary that this donor:acceptor molecule can form a columnar and helical stack.

Finally, this donor:acceptor molecule must allow good separation between the energetic levels of the HOMO and LUMO orbitals.

The compounds of the invention have these properties, as will be demonstrated in the following Examples and Comparative Examples.

Example 1

A compound according to the invention of Formula I-1 in which n=0 is synthesized, i.e. the ZP46 polymers are bonded to the 2 and 6 positions of the hexabenzocoronene core directly, and wherein the substituents R$^1$, R$^3$, R$^4$ and R$^6$ are a carboxylic group (—COOH).

FIG. 2 shows the localization of the HOMO and LUMO orbitals of this compound.

As may be seen in FIG. 2, the LUMO orbital in this compound of the invention is not localized only on the HBC core (the localization of the electrons is shown by a darker part) but is delocalized towards the polymer ZP46 itself, thus hindering the dissociation of the charges and their transfer in the direction of the stack rr, but nevertheless allowing such a dissociation and such a transfer. In other words, this compound may be used in applications in which perfect efficiency is not necessary but in which resistance to photo oxidation is important.

Example 2

A compound according to the invention of formula I in which n=0 (no spacer between the polymer ZP46, and the hexabenzocoronene core) was synthesized and the substituents R$^1$, R$^3$, R$^4$ and R$^6$ are cyano groups (—C≡N).

FIG. 3 shows the localization of the electrons in the HOMO and LUMO orbitals of this compound.

As may be seen in FIG. 3, the LUMO orbital in the compound of the invention is not only localized on the HBC core but is delocalized towards the ZP46 polymer itself, thus hindering the dissociation of the charges and their transfer into the direction of the stack π, but still allowing such a dissociation and such a transfer. In other words, this compound may be used in applications in which perfect efficiency is not necessary, but in which resistance to photo oxidation is important.

Example 3

A compound according to the invention of formula I in which n=0 (the ZP46 polymers are directly linked to the 2 and 5 positions of the hexabenzocoronene core, without a spacer) was synthesized, and in which the substituents R$^1$, R$^3$, R$^4$ and R$^6$ are CF$_3$ groups.

FIG. 4 shows the localization of electrons in the HOMO and LUMO orbitals of this compound.

As may be seen in FIG. 4, the LUMO orbital in this compound is not only localized on the HBC core but is delocalized towards the ZP46 polymer, while nevertheless allowing such dissociation and transfer. In other words, this compound may be used in applications in which perfect efficiency is not necessary, but in which resistance to photo oxidation is important.

It may also be seen from FIG. 2 to 4 that the HOMO orbital is localized on the ZP46 polymer very distinctly from the HBC core, and that even if the LUMO orbital in these compounds is not localized perfectly on the HBC core, it still remains very localized on the latter.

Without wishing to be bound by the theory, the inventors believe that the fact that the LUMO orbital in these compounds is not only localized on the HBC core may be due to the properties of the co-monomer acceptor of ZP46 which is directly related at the HBC core and which can compete during the relocalization of the LUMO level electronic cloud (poor electronic character in the basic state). However, the grafting of the ZP46 copolymer in the other direction, i.e. by first directly bonding the donor half, is undesirable because of the lack of non-binding interaction by hydrogen bonds between the segment and the HBC core.

However, the conformational stability as well as the resistance to photooxidation of these compounds is greatly increased. The same phenomenon was obtained when the substituents R$^1$, R$^3$, R$^4$ and R$^6$ of the HBC core were modified to be not carboxylic groups but cyano, or isocyanate, or cyanate or F groups.

Therefore, the compound of the invention in which the ZP46 polymer is directly bonded to the HBC core has a strong interest as a donor:acceptor couple due to its remarkable resistance to photooxidation compared to an ideal molecule.

The choice of substituent $R^1$, $R^3$, $R^4$ and $R^6$ is very important to obtain efficient charge separation during excitation by light.

For this purpose, compounds of formula I in which n=0 but in which the substituents $R^1$, $R^3$, $R^4$ and $R^6$ are respectively an F atom, an —NH2 group, an —NO2 group were synthesized and are the subject of Comparative Examples 1 to 3 that follow, and they demonstrate that these choices are very important.

Comparative Example 1

A compound of Formula I is synthesized, wherein n=0, i.e. a compound in which the ZP46 polymers are directly bonded to the 2- and 5-positions of the hexabenzocoronene core, and wherein the $R^1$, $R^3$, $R^4$ and $R^6$ substituents are an F atom.

The localization of the HOMO and LUMO molecular orbitals of this compound is shown in FIG. 5.

As may be seen in FIG. 5, the LUMO orbital is not localized at all on the HBC core in this molecule.

This compound can not therefore be used as a donor: acceptor couple in an active layer.

Comparative Example 2

A compound of Formula I in which n=0 and $R^1$, $R^3$, $R^4$ and $R^6$ are —NH2 groups, was synthesized.

FIG. 6 shows the localization of the HOMO and LUMO molecular orbitals in this compound.

As may be seen in FIG. 6, the LUMO orbital is not localized at all on the HBC core but is totally delocalized to the ZP46 polymer. We even get the opposite of what we are looking for: the electrons must go from the donor to the acceptor by passing from the HOMO to the LUMO.

Such a molecule can not be used as a donor:acceptor couple in an active layer.

Comparative Example 3

A compound of Formula I is synthesized, wherein n=0 and the substituents $R^1$, $R^3$, $R^4$ and $R^6$ are —NO$_2$ groups.

FIG. 7 shows the localization of the HOMO and LUMO orbitals in this compound.

As may be seen in FIG. 7, the LUMO orbital is practically not localized on the HBC core but focuses on the substituents $R^1$, $R^3$, $R^4$ and $R^5$, strong electron attractors: the latter will never release the electrons to create the desired current. In fact, there is no other chemical function that is more asiduous in trapping electrons. NO$_2$ will never release them if it manages to capture them.

This compound can not be used as a donor:acceptor couple of an active layer.

In order to overcome the problem of the weak localization of the compounds of the invention of Formula I in which the ZP46 polymers are directly bonded to the HBC core, the inventors have discovered that when a spacer group is used between the HBC core and the polymer ZP46, the problem of loss of efficiency of charge separation was overcome, when this spacer was an amide group (—CONH—) or an ester group (—COO—).

Indeed, the choice of the presence and nature of this spacer makes it possible to obtain good separation of the charges during excitation by spatially efficient light, as will be shown in the examples which follow.

Example 4

A compound of Formula I is synthesized, wherein n=1, X (spacer) is —CONH—, and the substituents $R^1$, $R^3$, $R^4$ and $R^6$ are CF$_3$ groups.

FIG. 8 shows the localization of the HOMO and LUMO molecular orbitals in this compound.

As may be seen in FIG. 8, the LUMO orbital is localized on the HBC core, while the HOMO orbital is localized on the ZP46 polymer.

This compound is, therefore, perfectly adapted to form the donor:acceptor couple of an active layer.

Example 5

A compound of Formula I is synthesized, wherein n=1, X (spacer) is —CONH—, and the substituents $R^1$, $R^3$, $R^4$ and $R^6$ are cyano (CN).

FIG. 9 shows the localization of the HOMO and LUMO orbitals in this compound.

As may be seen, the LUMO orbital is perfectly localized on the HBC core.

This compound is therefore adapted to form the donor: acceptor couple of an active layer.

Example 6

A compound of Formula I is synthesized, wherein n=1, X (spacer) is —CONH, and the substituents $R^1$, $R^3$, $R^4$ and $R^6$ are —COOH groups.

FIG. 10 shows the localization of the HOMO and LUMO orbitals of this compound.

As may be seen, the LUMO orbital is perfectly localized on the HBC core.

This compound is, therefore, perfectly adapted to form the donor:acceptor couple of an active layer.

Comparative Examples 4 to 6

In Comparative Examples 4 to 6, compounds of Formula I were synthesized, wherein n=1, X (spacer) is —CONH—, and wherein, respectively, the substituents $R^1$, $R^3$, $R^4$ and $R^5$ are all either F or an —NH$_2$ group or an —NO$_2$ group, to show the importance of the choice of these substituents.

FIG. 11 to 13 show the localization of the HOMO and LUMO orbitals in each of these compounds respectively.

As may be seen in FIG. 11, when the substituents $R^1$, $R^3$, $R^4$ and $R^5$ are F atoms, the LUMO orbital is delocalized over the entire molecule. This molecule can not constitute the donor:acceptor couple of an active layer.

As may be seen in FIG. 12, the compound of formula I in which the substituent $R^1$, $R^3$, $R^4$ and $R^6$ is an —NH 2 group can not constitute either the donor:acceptor couple or an active layer: the LUMO orbital is totally delocalized on ZP46 polymers.

The compound of Comparative Example 6 in which the substituents $R^1$, $R^3$, $R^4$ and $R^6$ are —NO 2 groups can not be a donor:acceptor couple of an active layer, as may be seen in FIG. 13: wherein the LUMO orbital is delocalized on these substituents and not localized on the HBC core.

Examples 7 to 9

These examples are intended to show that when the spacer is a —COO— group, the compound of formula I according to the invention is an excellent donor:acceptor couple of an active layer.

A compound of Formula I in which the substituents $R^1$, $R^3$, $R^4$ and $R^6$ are —CF$_3$ groups is synthesized in Example 7, wherein the substituents $R^1$, $R^3$, $R^4$ and $R^6$ are —CN groups, while, in Example 9, the substituents $R^1$, $R^3$, $R^4$ and $R^6$ are —COOH groups.

The localization of the HOMO and LUMO molecular orbitals of each of these compounds is shown in FIGS. 14, 15 and 16, respectively.

As may be seen in these figures, the LUMO orbital is perfectly localized on the HBC core in these compounds.

Comparative Examples 7 to 9

To show the importance of the nature of the substituents $R^1$, $R^3$, $R^4$ and $R^5$ in the compounds of Formula I in which the spacer is a —COO group, a compound of Formula I was synthesized in Comparative Example 7, wherein the substituents $R^1$, $R^3$, $R^4$ and $R^6$ are F atoms, in Comparative Example 8 wherein the substituents $R^1$, $R^3$, $R^4$ and $R^6$ are —NH$_2$, and in Comparative Example 9 a compound of Formula 1 wherein the substituents $R^1$, $R^3$, $R^4$ and $R^6$ are an —NO$_2$ group.

The localization of the HOMO and LUMO molecular orbitals of these compounds is shown in FIG. 17 to 19, respectively.

As may be seen in FIGS. 17 and 18, the LUMO orbitals of the compounds obtained in Comparative Examples 7 and 8 are completely delocalized on the ZP46 polymers, while, in the compound of Comparative Example 9, the LUMO orbital is delocalized on the electron attractor substituents —NO$_2$.

These compounds can not therefore form the donor:acceptor couple of an active layer.

Comparative Examples 10 to 15

These examples show that the nature of the spacers is also very important.

Compounds of Formula I were synthesized in which n=1 and X, the spacer, was —C≡C—.

In Comparative Example 10, the substituents $R^1$, $R^3$, $R^4$ and $R^6$ are a —CF$_3$ group, in Comparative Example 11, the substituents $R^1$, $R^3$, $R^4$ and $R^6$ are a-C≡N group, in Comparative Example 12, the substituents $R^1$, $R^3$, $R^4$ and $R^6$ are a —COOH group, and in Comparative Example 13 the substituents R1, R3, R4 and R6 are F, in Comparative Example 14 the substituents $R^1$, $R^3$, $R^4$ and $R^6$ are —NH$_2$, and in Comparative Example 15, the substituents $R^1$, $R^3$, $R^4$ and $R^6$ are —NO$_2$ groups.

FIG. 20 to 25 show respectively the localization of the HOMO and LUMO orbitals of these compounds.

As may be seen in FIG. 20 to 24, the compounds of Comparative Examples 10 to 14 can not form a donor:acceptor couple of an active layer, the LUMO orbital is delocalized on ZP46 polymers.

As may be seen in FIG. 25, the compound of Comparative Example 15 can not be used as a donor:acceptor couple for an active layer: the LUMO orbital is delocalized on the substituents $R^1$, $R^3$, $R^4$ and $R^6$, i.e. on —NO$_2$ groups.

As may be seen in FIGS. 8 to 10, the use of a function amide (—CONH—) as a spacer in the compound of the invention makes it possible to effectively separate the charges during excitation by light: there is no overlap between the base level and the excited states of boundary orbitals, which indicates effective separation of charges.

As may be seen in FIG. 7 to 9, the same effect is observed when an ester spacer (—COO—) is used, and, moreover, the insertion of this group as a spacer is of interest especially since it can form hydrogen bonds blocking the planarity between the ZP46 conjugated polymer and the HBC core, as shown in FIG. 26.

FIG. 26 shows a schematic representation of the compound of Example 9, i.e. a compound of Formula I, wherein n=1, X (spacer) is —COO—, and the substituents $R^1$, $R^3$, $R^4$ and $R^6$ are —COOH groups.

As may be seen in FIG. 26, the compound of Example 9 has a blocked planarity between the HBC core and the ZP46 polymer, in particular by non-linking interactions of the hydrogen bonding type which are represented in FIG. 26 by the dashed circles. These interactions are interactions between the C=O groups of the ZP46 polymer and the $R^3$ and $R^6$ substituents.

The compounds of Formula I in which the spacer is an ester group is of further interest: they are easy to synthesize, especially when the substituents $R^1$, $R^3$, $R^4$ and $R^6$ are carboxylic groups.

Compounds of the invention having good planarity can form columnar and helical stacks.

The first two conditions, namely the localization of the charges and in particular the LUMO and HOMO molecular orbitals, and the ability to create a stable columnar and helical structure, are thus fulfilled by the compounds of the invention.

To show that the compounds of the invention do not introduce a loss of efficiency while maintaining the energy separation between the HOMO and LUMO molecular orbitals, their HOMO and LUMO energy levels were measured.

These values of HOMO and LUMO energy levels are shown in Table 1 below.

TABLE 1

| | Without spacer | | Spacer —CC— | | Spacer —CONH— | | Spacer —COO— | |
|---|---|---|---|---|---|---|---|---|
| | HOMO (eV) | LUMO (eV) | HOMO (eV) | LUMO (eV) | HOMO (eV) | LUMO (eV) | HOMO (eV) | LUMO (eV) |
| $R^2$ and $R^5$ = ZP46 $R^1$, $R^3$, $R^4$ and $R^6$ = | | | | | | | | |
| —CF$_3$ | −7.39 | −1.89 | −7.39 | −1.83 | −7.38 | −1.95 | −7.39 | −1.94 |
| —CN | −7.40 | −1.93 | −7.40 | −1.86 | −7.39 | −1.99 | −7.39 | −1.98 |
| —COOH | −7.39 | −1.85 | −7.39 | −1.82 | −7.40 | −2.09 | −7.40 | −1.88 |
| —F | −7.39 | −1.83 | −7.39 | −1.82 | −7.38 | −1.80 | −7.39 | −1.80 |

TABLE 1-continued

|  | Without spacer | | Spacer —CC— | | Spacer —CONH— | | Spacer —COO— | |
| --- | --- | --- | --- | --- | --- | --- | --- | --- |
|  | HOMO (eV) | LUMO (eV) | HOMO (eV) | LUMO (eV) | HOMO (eV) | LUMO (eV) | HOMO (eV) | LUMO (eV) |
| —NH$_2$ | −6.75 | −1.80 | −6.77 | −1.81 | −6.97 | −1.79 | −6.90 | −1.80 |
| —NO$_2$ | −7.40 | −3.10 | −7.40 | −3.15 | −7.39 | −3.29 | −7.39 | −3.22 |
| $R^1$, $R^3$, $R^4$ and $R^6$ = H $R^2$ and $R^5$ = ZP46 | −7.40 | −1.82 | | | | | | |
| $R^1$, $R^3$, $R^4$ and $R^6$ = COOH $R^2$ and $R^5$ = H HBC(COOH)$_4$ | −7.73 | −1.66 | | | | | | |
| $R^1$, $R^3$, $R^4$ and $R^6$ = COOH $R^2$ and $R^5$ = (P3OPT)$_{10}$ HBC(COOH)$_4$—(P3AOPT)$_{10}$ | −6.31 | −1.16 | | | | | | |
| $R^1$, $R^3$, $R^4$ and $R^6$ = H $R^2$ and $R^5$ = (P3OPT)$_{10}$ P3AOT$_{10}$ | −6.39 | −1.15 | | | | | | |

As may be seen from Table 1, the compounds of the invention do not introduce a loss of efficiency and maintain the energy separation between the HOMO and LUMO molecular orbitals.

In a particularly preferred embodiment of the invention, the hexabenzocoronene compound of Formula I is a compound in which the ZP46 polymer is bonded to the HBC core by a spacer which is either —CONH— or —COOX—, and more particularly in which the spacer is —COO—.

An active layer comprising a compound of Formula I according to the invention, therefore, has characteristics of resistance to photooxidation and particularly advantageous electronic properties.

In the same way, an electronic device comprising such a compound has a particularly advantageous conformational stability and photooxidation resistance.

Such an electronic device is, in particular, an organic photovoltaic cell.

The compounds of the invention were synthesized according to the following reaction scheme wherein in step e), mW means microwave heating, and DDQ means 2,3-dichloro-5,6-1,4-benzoquinone.

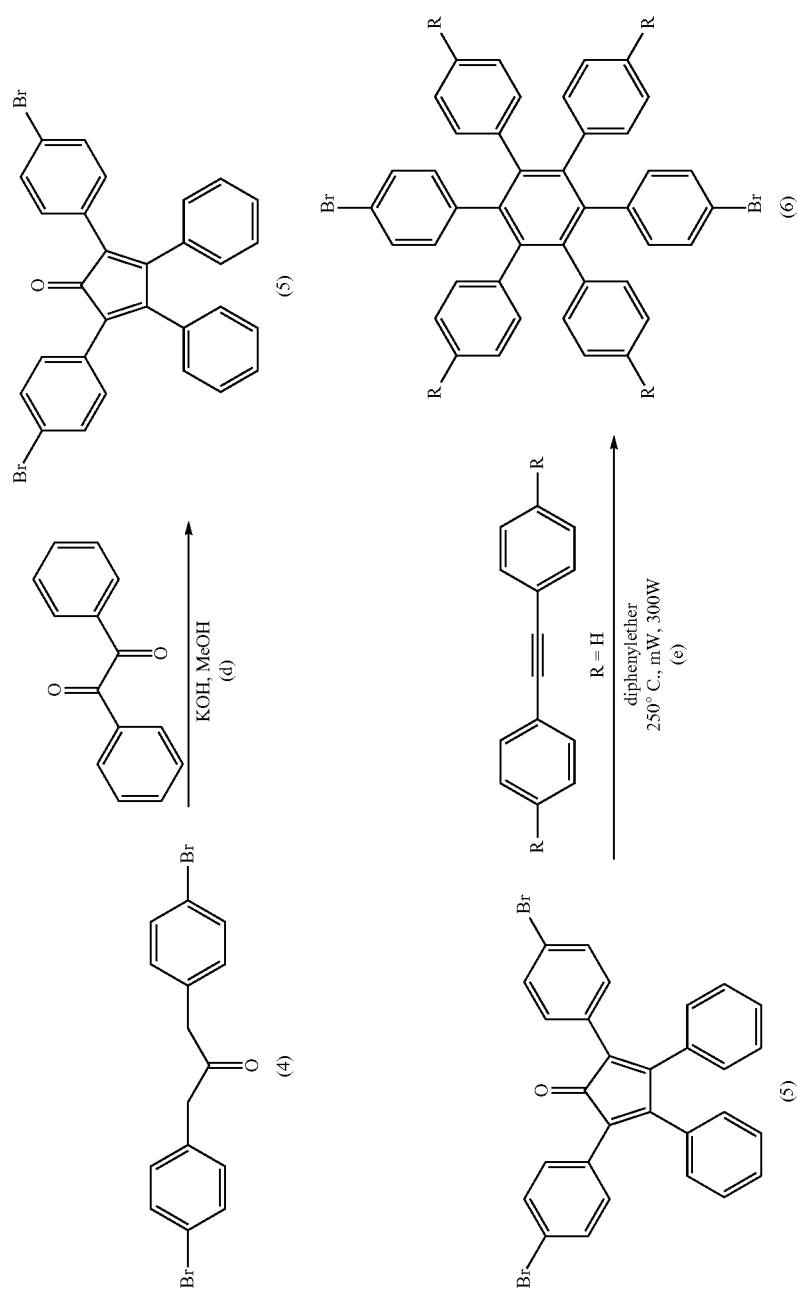

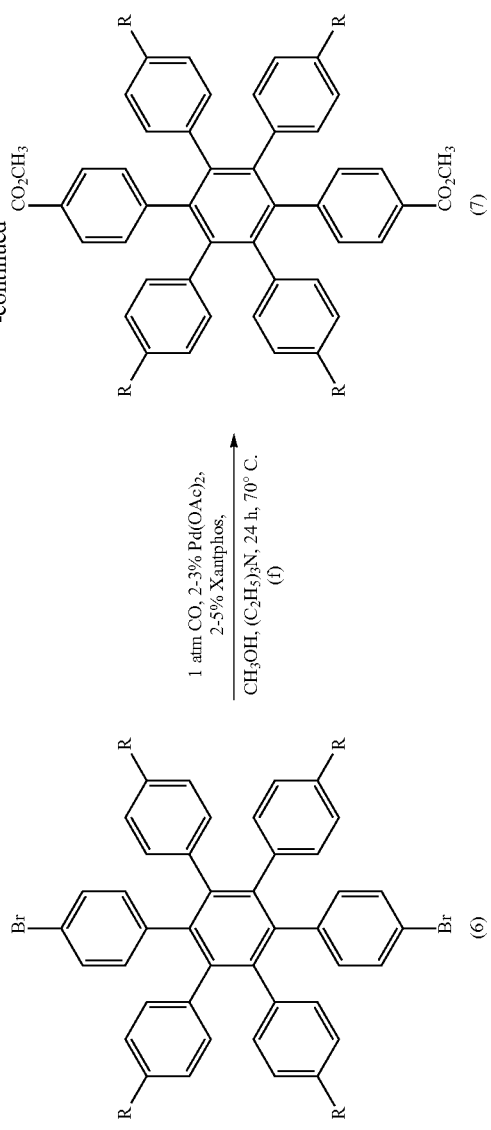
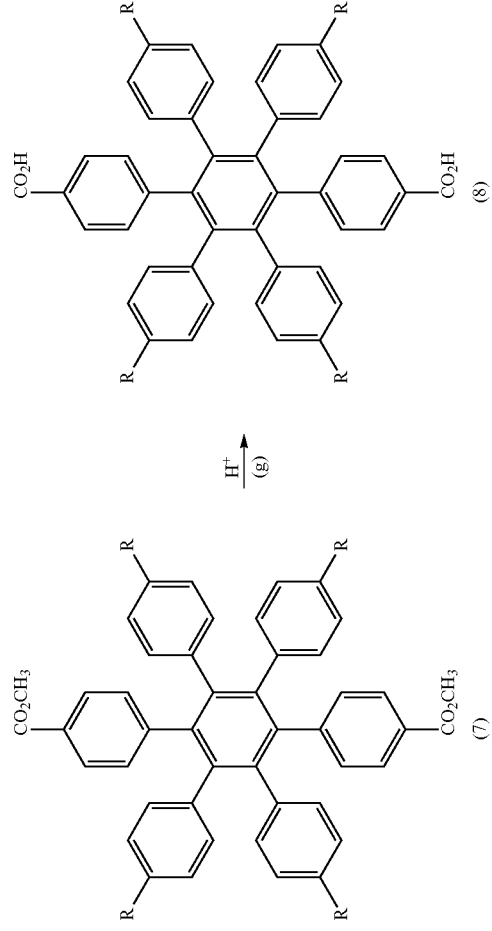

-continued
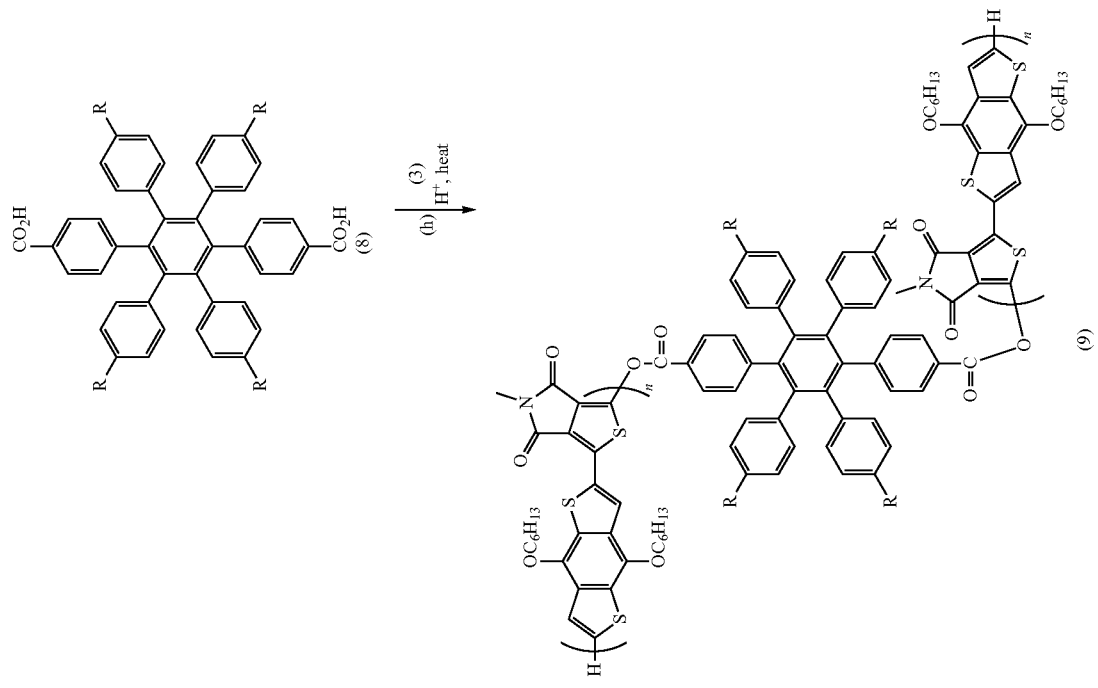

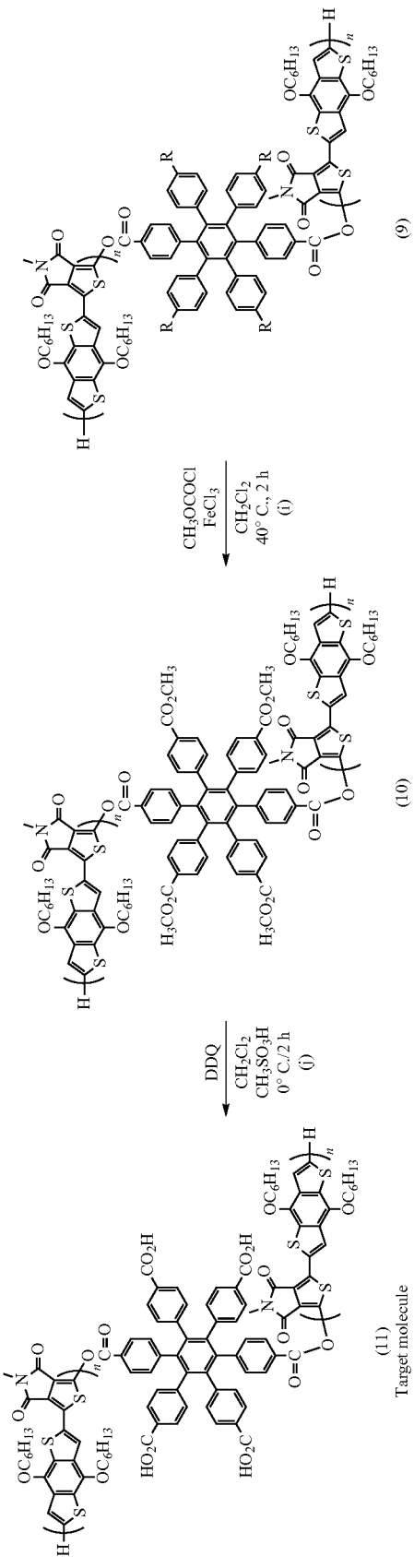

This reaction scheme shows more precisely the synthesis of the preferred compound of the invention in which the spacer is a —COO— group.

Step f) was carried out as described in J. R. Martinelli, D. A. Watson, D. M. M. Freckmann, T. E. Barder, and S. L. Buchwald, J. Org. Chem. 2008, 73, 7102-7107 and C. Wai Cheung and S. L. Buchwald, Organic Letters, 2013, 15, 3998-4001.

The compound ZP46 used for synthesizing the compounds of the invention was synthesized according to the following reaction scheme:

The precatalyst used in step b) was a Palladacycle precatalyst described in C. Wai Cheung and S. L. Buchwald, Organic Letters, 2013, 15, 3998-4001.

The invention claimed is:

1. Compound based on hexabenzocoronene having the following Formula I:

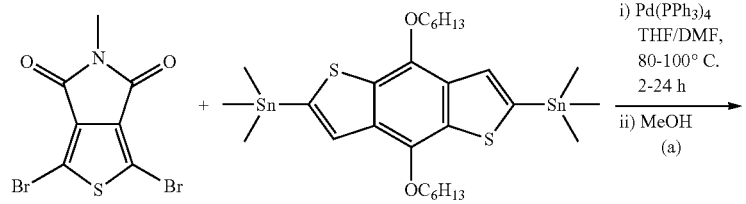

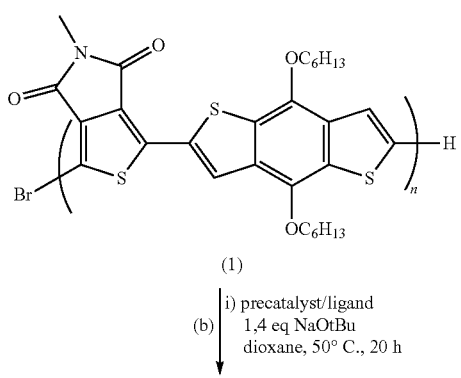

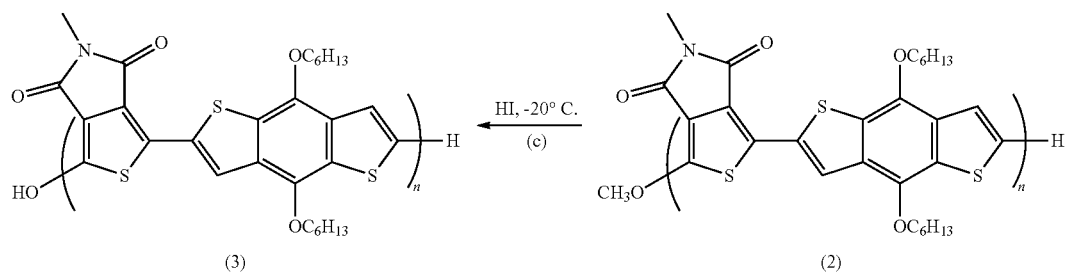

Formula I

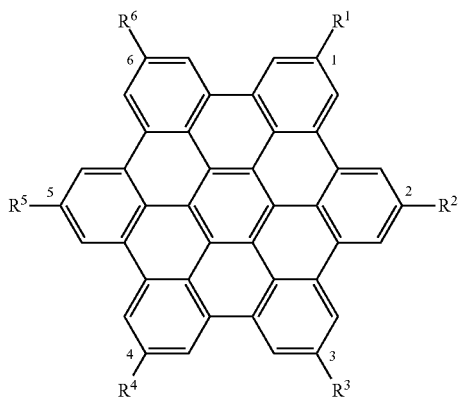

in which:
R[1], R[3], R[4] and R[6] are chosen, independently of each other, from a carboxylic group (—COOH), a cyano group (—C≡N), an isocyanate group; (—N+≡C—), a cyanate group (—O—C≡N) and a group (CF$_3$), while R[2] and R[5] have the following Formula (1):

$X_{(n1)}$-ZP46       Formula (1)

in which:
X is a spacer group selected from a group —COO— and a group —CONH—,
$n_1$=0 or 1, and
ZP46 has the following Formula (2):

Formula (2)

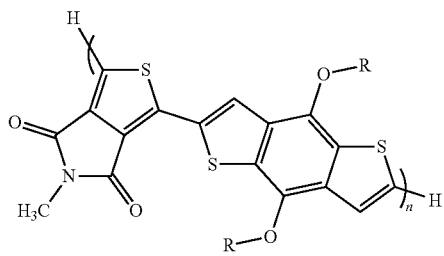

wherein R is methyl or $C_6H_{13}$.

2. Compound based on hexabenzocoronene according to claim 1, wherein R[1], R[3], R[4] and R[6] are the same and are carboxylic groups.

3. Compound based on hexabenzocoronene according to claim 1, wherein in Formula I, n1=1 and X is a —COO— group.

4. Compound according to claim 1 wherein R is methyl.
5. Compound according to claim 1 wherein R is $C_6H_{13}$.
6. Compound according to claim 1 of Formula I-1 below:

Formula I-1

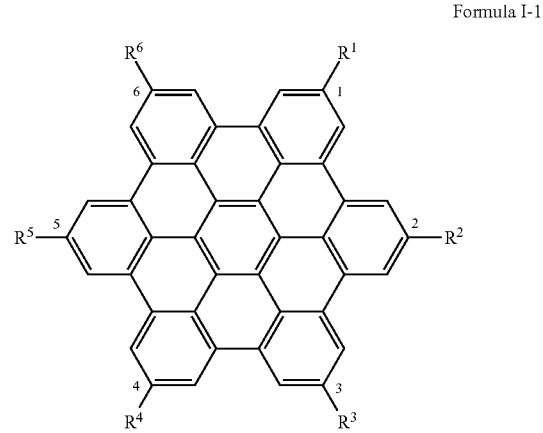

wherein R[1], R[3], R[4] and R[6] are carboxylic groups and R[2] and R[5] have the Formula —COO-ZP46, wherein ZP46 has the following Formula (2):

Formula (2)

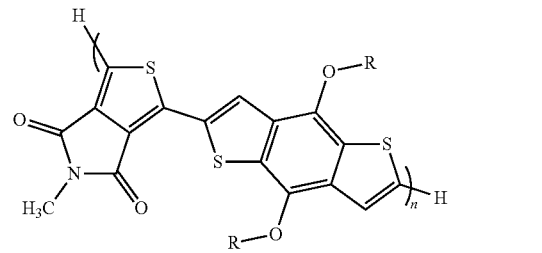

wherein R is methyl or $C_6H_{13}$.

7. Donor:acceptor layer comprising a stack of hexabenzocoronene compounds according to claim 1.
8. Device comprising at least one compound based on hexabenzocoronene according to claim 1.
9. Device according to claim 8 which is a photovoltaic cell.

* * * * *